United States Patent
Mikagi

(12) 
(10) Patent No.: US 6,566,254 B1
(45) Date of Patent: May 20, 2003

(54) METHOD FOR FORMING A SILICIDE FILM ON GATE ELECTRODES AND DIFFUSION LAYERS OF MOS TRANSISTORS

(75) Inventor: Kaoru Mikagi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/489,355

(22) Filed: Jan. 21, 2000

(30) Foreign Application Priority Data

Jan. 22, 1999 (JP) .......................................... 11-014160

(51) Int. Cl.⁷ ............................................. H01L 21/44
(52) U.S. Cl. ....................................... 438/660; 438/664
(58) Field of Search ................................ 438/660, 197, 438/198, 199, 664

(56) References Cited

U.S. PATENT DOCUMENTS

| 4,477,736 | A | * | 10/1984 | Onishi ........................ 307/297 |
| 4,804,636 | A | * | 2/1989 | Grover, III et al. ........... 437/52 |
| 5,759,899 | A | * | 6/1998 | Saito ........................... 438/303 |
| 6,121,137 | A | * | 9/2000 | Saito ........................... 438/682 |
| 6,150,248 | A | * | 11/2000 | Sekiguchi et al. .......... 438/592 |
| 6,174,796 | B1 | * | 1/2001 | Takagi et al. ............... 438/622 |

FOREIGN PATENT DOCUMENTS

| JP | 06112219 | 4/1994 |
| JP | 09121055 A | 5/1997 |
| JP | 09148568 | 6/1997 |

OTHER PUBLICATIONS

Technical Digest of the *International Electron Devices Meeting*, Washington, DC (1995).

* cited by examiner

*Primary Examiner*—Kamand Cuneo
*Assistant Examiner*—Scott Geyer
(74) *Attorney, Agent, or Firm*—Choate, Hall & Stewart

(57) ABSTRACT

A silicide film is selectively formed at least on diffusion layers of a MOS transistor. In the method for forming the silicide film includes, a first metal film is selectively formed at least on diffusion layers. A first annealing is applied to allow at least the diffusion layers to react with the first metal film. A part of the sidewalls is removed to form a gap with reacted film of the first metal film. A second annealing is performed at a temperature higher than that of the first annealing to form a reacted film. This makes it possible to form a silicide film having preferable electric characteristics on a gate and diffusion layers being fine in dimension and high in impurity concentration, in a self-aligning fashion without producing "bite of silicide."

13 Claims, 6 Drawing Sheets

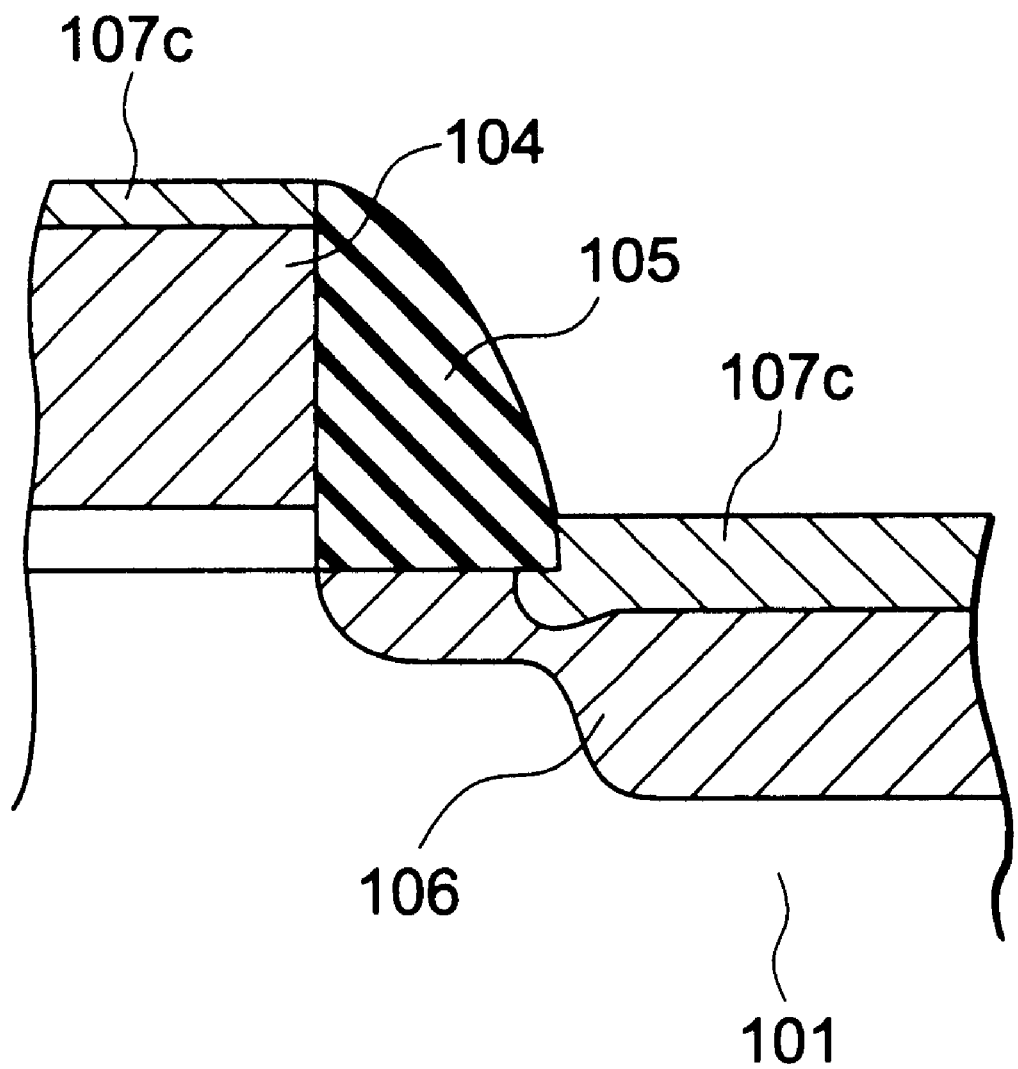

METHOD FOR FORMING A SILICIDE FILM ON GATE ELECTRODES AND DIFFUSION LAYERS OF MOS TRANSISTORS

BACKGROUND OF THE INVENTION

1. Field of the Invention

The present invention relates to a method for manufacturing semiconductor device, and more particularly to a method for forming electrodes by using a salicide technology for selectively forming a silicide film on gate electrodes and diffusion layers of MOS transistors.

2. Description of the Related Art

In salicide (self align silicide) technologies for forming a silicide film on gate electrodes and diffusion layers of MOS transistors in a self-aligning fashion, it is important that the silicide film to be formed on the gate electrodes and diffusion layers is uniform in film thickness and stable in electric resistance. This prefers to employ a salicide technology using titanium (Ti) which produces silicides having smaller specific resistances and has an appropriate Schottky barrier height to both p-types and n-types. However, when the gate electrodes and diffusion layers rise in surface impurity concentration with increasing fineness of semiconductor devices and become finer in dimension as well, the silicides with titanium increase in the temperature at which phase transition occurs from high-resistance C49 titanium disilicide ($TiSi_2$) to low-resistance C54 titanium disilicide, especially on the n-type diffusion layers. Accordingly, adjusting the silicidation-annealing temperature to the n-type produces a problem in that excessive silicidation on the p-type conductive layers causes deterioration of the p-n junction leakage characteristics and aggregation of the silicide films. On the contrary, adjusting the annealing temperature to the p-type creates a problem in that insufficient silicidation on the n-type diffusion layers makes the silicide films smaller in thickness, higher in resistance, and so on. Therefore, the technology is far from being sufficient to form a silicide film on gate electrodes and diffusion layers in a self-aligning fashion.

Thus, for example, K. Goto et al, Technical Digest of IEEE International Electron Device Meeting 1995, pp.449–452 (1995) discloses a technique of selectively forming a silicide film on gate electrodes and diffusion layers in a self-aligning fashion by using cobalt (Co). This conventional technology will be described below. FIGS. 1A through 1C are longitudinal sectional views showing this conventional technology in the order of its steps. Initially, as shown in FIG. 1A, element isolation regions 102 are formed on prescribed areas of a single-conductive type silicon substrate 101 by using a LOCOS method. The element isolation regions 102 define an element forming region on which a gate oxide film 103 and gate silicon film 104 are formed. Sidewalls 105 are formed on the side surfaces of the gate silicon film 104. Formed in said silicon substrate 101 are reverse-conductive type diffusion layers 106 serving as source and drain regions with an n+/p junction depth of 100 nm, thereby forming a MOS transistor. Thereafter, a cobalt film 107a is formed in a thickness of 10 nm by sputtering so as to cover said MOS transistor, followed by a titanium nitride (TiN) film 108b formed in a thickness of 30 nm by sputtering. The purpose of said titanium nitride film 108b is to prevent cobalt from being oxidized during the annealing treatments for silicidation.

Subsequently, as shown in FIG. 1B, first annealing is applied to the silicon substrate 101 in a nitrogen atmosphere at 550° C. for 30 seconds by ramp rapid thermal annealing method. This allows the surface portions of the gate silicon film 104 and diffusion layers 106 to react with the cobalt film 107a, forming cobalt silicide films 107b having a composition of $Co_xSi_y$ ($x \geq y$) in a self-aligning fashion.

Then, as shown in FIG. 1C, the titanium nitride film 108b and the unreacted cobalt films 107a remaining on the field are removed by wet etching before second annealing is applied in a nitrogen atmosphere at 750–900° C. for 30 seconds by ramp rapid thermal annealing. This transforms said cobalt silicide films 107b on the surfaces of the gate silicon film 104 and diffusion layers 106 into cobalt disilicide ($Cosi_2$) films 107c which are thermally stable and low in resistance. In this technique, the use of cobalt for the silicidation metal instead of titanium can solve said problems in the higher resistances and silicide film aggregation resulting from the finer patterns and the increase in the phase transition temperature from the C49 structure to C54 structure in the regions with higher impurity concentrations.

This salicide technology, however, is to deposit a metal film over the entire surface of the silicon substrate and allow silicidation only on the silicon-exposed regions for resistance reduction, so that the silicidation inevitably involves the metal film on the insulating films lying in the vicinity of the element isolation ends and pattern edges. On this account, a problem occurs on the occasion when those metals compared to titanium and the like with higher silicon consumption in silicidation, such as cobalt, are applied to finer semiconductor devices.

More specifically, when the diffusion layers and gate electrodes become finer and finer involving decreases in the p-n junction depth of the diffusion layers, there occurs "bite of silicide" in which the silicide films 107c penetrate into the silicon substrate 101 at the ends of the element isolation regions 102 and beneath the sidewalls 105 on the gate-electrode side. As seen under the sidewall 105 in FIG. 2, the silicide films 107c came close to the p-n junction plane of the diffusion layers 106, which might deteriorate characteristics such as junction leakage, isolation withstand voltage, and gate withstand voltage. In particular, diffusion layers 106 of LDD structure have thinly-formed LDD regions, which increases the danger of the deterioration. Accordingly, this technique is also far from a salicide technology that can offer an ultimate solution to the above-described problems.

SUMMARY OF THE INVENTION

An object of the present invention is to provide a method for manufacturing a semiconductor device which forms in a self-aligning fashion a silicide film being low in resistance and stable in electric characteristics even on gate electrodes and diffusion layers being fine in dimension and high in impurity concentration, without deteriorating characteristics such as junction leakage, isolation withstand voltage, and gate withstand voltage.

A method for manufacturing a semiconductor device according to the present invention comprises the steps of: forming a gate electrode, sidewalls provided on both side surfaces of said gate electrode, and diffusion layers formed at a surface of a silicon substrate by a self-aligning technique within an element forming region defined by element isolation regions provided on said silicon substrate; and forming a silicide film at least on the surfaces of said diffusion layers.

The step of forming a silicide film of a first aspect of the present invention comprises the steps of: selectively forming a first metal film at least on the diffusion layers; applying first annealing thereto to allow at least said diffusion layers to react with said metal film; removing part of sidewalls to form a gap with the first metal film; and performing second annealing at a temperature higher than that of the first annealing.

Moreover, a method for forming a silicide film of a second aspect of the present invention includes the steps or: forming a first metal film on the silicon substrate having a MOS transistor formed thereon; applying first annealing thereto to allow at least the diffusion layers to react with the first metal film; selectively removing unreacted portions of the aforesaid first metal film; removing part of sidewalls to form a gap with the first metal film; and performing second annealing at a temperature higher than that of the first annealing.

Furthermore, as a third aspect of the present invention, a method for forming a silicide film according to the present invention includes the steps of: forming a first metal film on the silicon substrate having a MOS transistor formed thereon; forming a second metal film on the aforesaid first metal film; applying first annealing thereto to allow at least the aforesaid diffusion layers to react with the first metal film; selectively removing the aforesaid second metal film and unreacted portions of the aforesaid first metal film; removing part of sidewalls to form a gap with the first metal film; and performing second annealing at a temperature higher than that of the first annealing.

According to the present invention, the sidewalls on the side surfaces of the gate electrode is etched back upon the completion of the first annealing for silicidation, to form a gap with the first metal film before the application of the second annealing for silicidation. This makes it possible to suppress the bite of silicide into the silicon substrate at least at the ends of the sidewalls during the silicidation. As a result, the ends of the silicide films are prevented from coming close to the p-n junction plane of the diffusion layers lying beneath the ends or the sidewalls. This improves the p-n junction leakage characteristics, inter-element withstand voltage characteristics, and gate withstand voltage characteristics of the diffusion layers, and makes it possible to form a silicide film having stable electric characteristics at least on the diffusion layers in a self-aligning fashion with higher controllability.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIG. 2 is a partial sectional view of a MOS transistor for illustrating the conventional problems;

DETAILED DESCRIPTION OF THE PREFERRED EMBODIMENTS

Hereinafter, preferred embodiments of the present invention will be described with reference to the accompanying drawings.

Figure 1A:
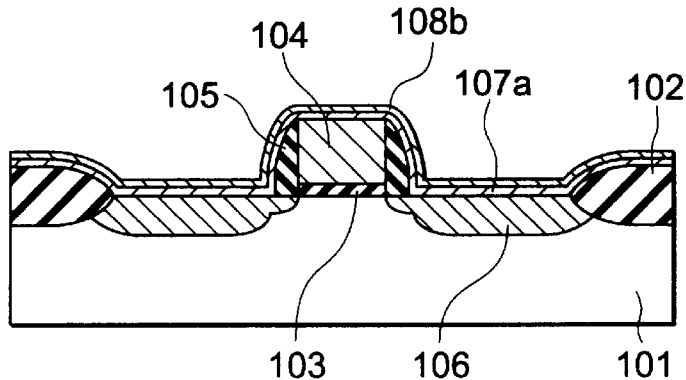
FIGS. 1A through 1C are longitudinal sectional views showing the conventional manufacturing steps.
Figure 1B:
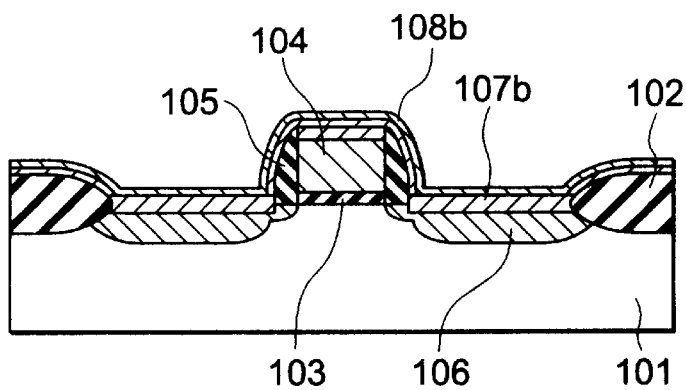
Figure 1C:
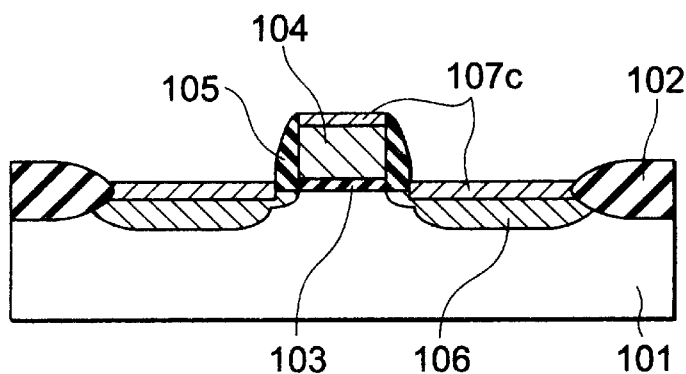
Figure 3A:
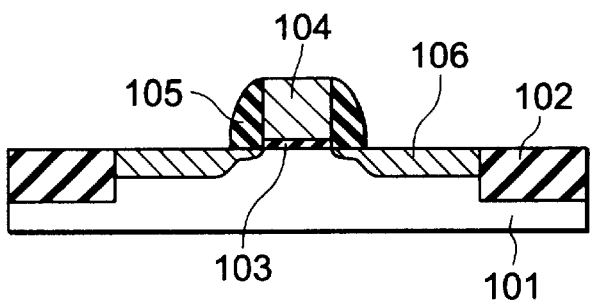
FIGS. 3A through 3E are longitudinal sectional views showing the method for manufacturing a semiconductor device in the order of its steps according to a first embodiment of the present invention.

Description will now be given of the first embodiment of the present invention. FIGS. 3A through 3E are longitudinal sectional views showing the method for manufacturing a semiconductor device in the order of its steps according to the first embodiment of the present invention. Initially, as shown in FIG. 3A, element isolation regions 102 of a groove-embedded structure consisting of a silicon oxide film embedded in a groove of 300–400 nm in depth and 200–500 nm in width are formed on prescribed areas of a single-conductive type silicon substrate 101. Then, on an element forming region defined by the element isolation regions 102 are formed a gate oxide film 103 having a thickness of 5 nm and a gate silicon film 104 consisting of poly-crystalline silicon, having a width of 100–250 nm and a thickness of 100–150 nm. Moreover, sidewalls 105 having a width of 80–100 nm, consisting of a silicon oxide film are formed on the sidewall portions of the gate silicon film 104. Diffusion layers 106 as source and drain regions of reverse conductive type are further formed in the silicon substrate 101 at both sides of said sidewalls, thereby forming a MOS transistor. In this connection, the sidewalls 105 may be previously formed somewhat greater in width because the sidewalls are subjected to etchback in a following step. In this embodiment, the diffusion layers 106 are formed as a source/drain of LDD structure.

Figure 3B:
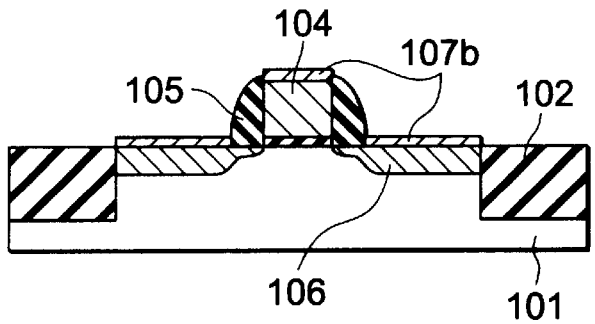

Then, as shown in FIG. 3B, cobalt films 101a of 10–15 nm in thickness are selectively formed only on silicon-exposed areas such as the surfaces of the diffusion layers 106 in the silicon substrate 101 and the surface of the gate silicon film 104, by selective chemical vapor deposition (selective CVD) using an organic source with bis(hexafluoroacetylacetonate) cobalt (II) ($Co(C_5HF_8O_2)_2$) as the organic source, the selective CVD of cobalt films is performed under the conditions of: a substrate temperature of 200–400° C.; a flow rate of carrier hydrogen gas of 100–400 sccm; a flow rate of evaporated bis(hexafluoroacetylacetonate) cobalt (II) of 10–40 sccm; and a pressure of 10–50 Pa. These conditions, although depending on the dimension of the silicon areas exposed, allow the cobalt films 107a to be deposited at a rate as relatively slow as 5–15 nm/min, which can form thin cobalt films with high uniformity and repeatability. This has an advantage of high applicability to semiconductor devices that have diffusion layers being smaller in p-n junction depth and therefore require thinner silicide films.

Figure 3C:
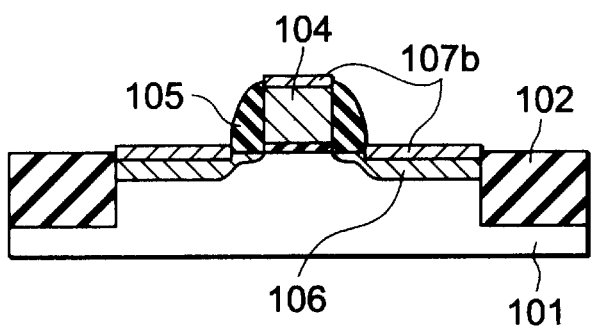

Subsequently, as shown in FIG. 3C, without breaking the vacuum, first annealing is applied to the silicon substrate 101 at 450–550° C. for 30 seconds in the same chamber as that used for the selective CVD of the cobalt films, or in a different vacuum chamber within the same CVD system. This allows the surface portions of the gate silicon film 104 and diffusion layers 106 to react with the cobalt films 107a, forming cobalt silicide films 107b having a composition of $Co_xSi_y$ ($x \geq y$) in a self-aligning fashion. This first annealing may be performed well by ramp rapid thermal annealing In a non-oxidizing atmosphere such as argon or nitrogen.

Figure 3D:
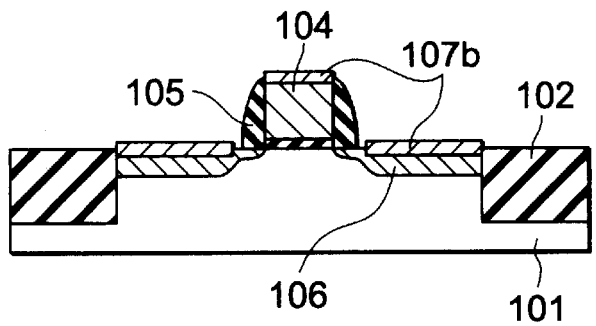

Thereafter, as shown in FIG. 3D, the sidewalls 105 are etched back by anisotropic, reactive ion etching which uses a fluorocarbon type gas such as $CF_4$ or $C_2F_6$. Thereby, gaps of 10–20 nm in width are formed between the cobalt silicide films 107b and the edge portions of the sidewalls 105. Since also subjected to the etching, the silicon oxide films of the element isolation regions 102 sometimes have their boundary portions receding from the element forming region. Care must be taken here because excessive etchback would increase the receding amounts of the sidewalls 105 and the silicon oxide films of the element isolation regions, possibly eliminating the sidewalls 105 or forming a recess in the element isolation regions 102. In order to prevent the gate silicon film 104 and diffusion layers 106 from receding, attention should also be paid to the etch selectivities between the silicon and silicide films and the oxide films.

Figure 3E:
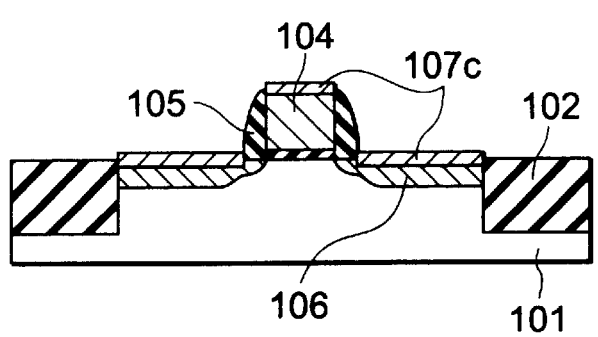

Then, as shown in FIG. 3E, second annealing is applied thereto in a nitrogen atmosphere at 700–800° C. for 10–30 seconds by ramp rapid thermal annealing. This transforms the cobalt silicide films 107b formed on the surfaces of the gate silicon film 104 and diffusion layers 106 into cobalt disilicide ($CoSi_2$) films 107c which are electrically stable. In this silicidation process, namely, $$CoSi + Si \rightarrow CoSi_2 \tag{III}$$

Co returns to the diffusion seed to facilitate production of "bite." However, due to the fact that the gaps of 10–20 nm in width are previously formed between the cobalt silicide films 107b and the sidewalls 105 by the anisotropic etchback and due to the selective growth of cobalt films, the cobalt films on the element isolation regions 102 are excluded from the silicidation. Accordingly, it is possible to prevent the "bite of silicide" at the ends of the element isolation regions 102 and the ends of the sidewalls 105.

Figure 4:
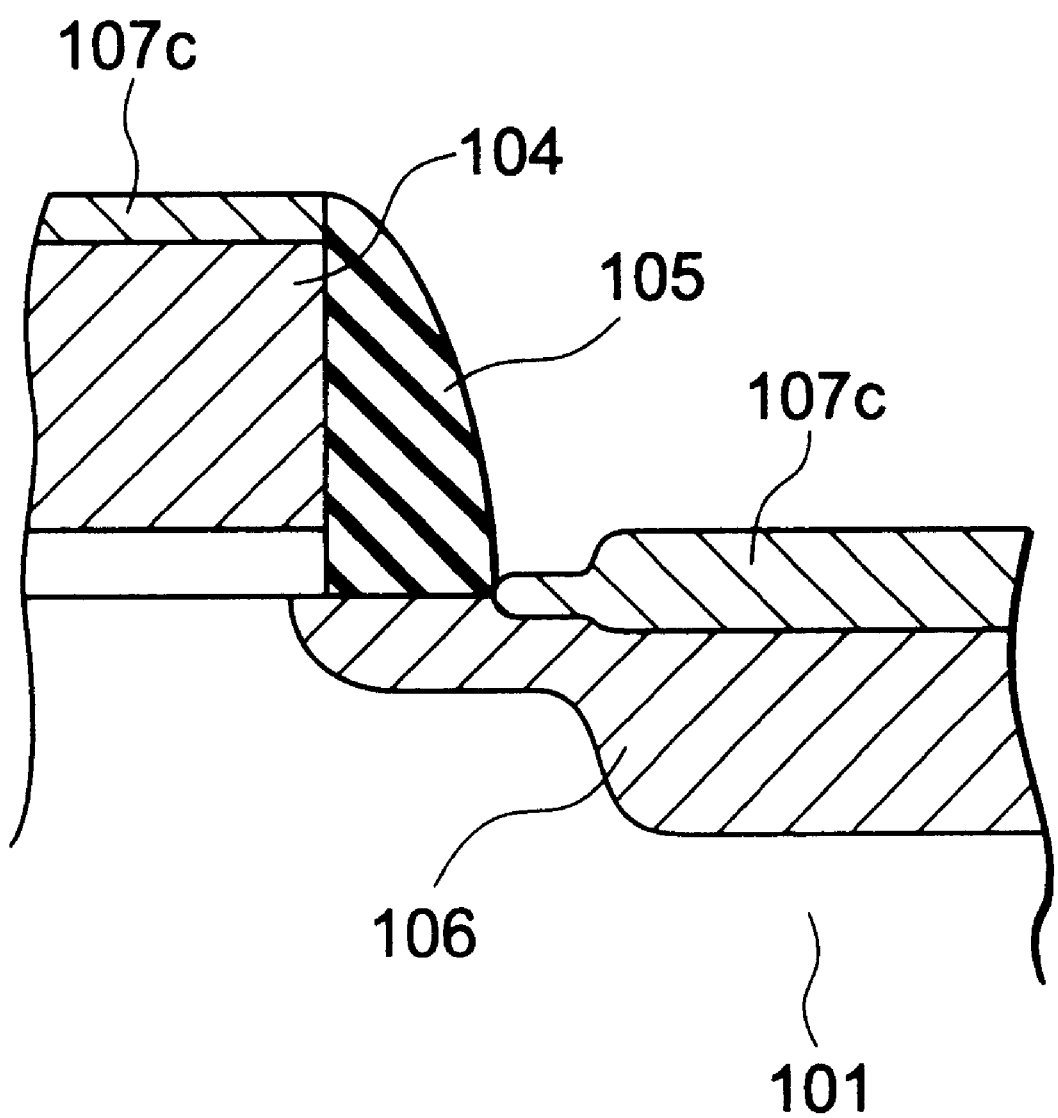
FIG. 4 is a partial sectional view showing a MOS transistor improved by the present invention.

That is, as seen under the end of the sidewall 105 in FIG. 4, the end of the cobalt disilicide film 107c hardly penetrates into the silicon substrate 101, not coming close to the p-n junction of the diffusion layer 106. Thus, according to this technique, the "bite" of silicide films at pattern edges can be suppressed even in fine patterns, making it possible to selectively form on all gates and diffusion layers a cobalt disilicide film which is excellent in inter-element withstand voltage characteristics, p-n junction leakage characteristics, and gate withstand voltage characteristics, and has stable electric characteristics.

Here, the selective deposition of the cobalt films 107a in the step shown in FIG. 3B is not limited to the CVD method described in the embodiment above, and may use other techniques as well. For example, electroless plating is one of the effective techniques. The electroless plating of cobalt uses a plating solution having cobalt chloride for its main component, added with hydrazine hydrochloride as a reducing agent, sodium tartrate as both a complexing agent and a buffering agent, and ammonia water as a pH controlling agent. The deposition of the cobalt films 107a is carried out in the following manner. That is, the silicon substrate 101 is immersed in a palladium chloride solution of 0.05–0.1 g/l in concentration for 10–30 seconds, selectively depositing palladium (Pd) films (now shown) as thin as 1–3 nm on only the silicon-exposed regions on the silicon substrate, followed by pure-water cleaning. The wafer is then immersed in a plating solution of 70–90° C. in temperature, the solution composed of 0.05 mol/l of cobalt chloride, 1.0 mol/l of hydrazine hydrochloride, and 0.4 mol/l of sodium tartrate, and being adjusted in pH to about 9 with ammonia water, sodium hydroxide, or the like. The immersion forms the cobalt films 107a of 10–15 nm in thickness selectively on the silicon-exposed regions, i. e., the gate silicon film 104 and diffusion layers 106. Under these conditions, the cobalt films 107a are formed at a film forming rate on the order of 30 nm/min. When smaller film forming rates are desired in view of film-thickness controllability, however, the plating solution may be lowered in pH and the plating temperature may be decreased.

While hydrazine hydrochloride is used as the reducing agent, the electroless cobalt plating solution is not limited thereto and may use sodium hypophosphite or potassium borohydride as the reducing agent instead. moreover, the silicidation metal is not limited to cobalt and may be nickel (Ni). In the case of electroless nickel plating, a plating solution having nickel sulfate for its main component, added with sodium hypophosphite, potassium borohydride, dimethylamineborane, or the like as a reducing agent may be used. Even in cases where the deposition in the electroless plating step deteriorates in selectivity to non-selective deposition, cobalt films or nickel films left on the field can be removed after the first annealing by using a mixed aqueous solution of ammonia and oxygenated water, or a mixed aqueous solution of hydrochloric acid and oxygenated water.

When the cobalt films or nickel films are deposited by electroless plating, then the first annealing for silicidation in the step of FIG. 3C is preferably carried out by ramp rapid thermal annealing in a non-oxidizing atmosphere such as argon and nitrogen. In the initial process of silicidation in this first annealing, namely, $$2Co + Si \rightarrow Co_2Si \tag{I}$$

the cobalt silicide films are formed so as to grow downward because Co acts as the diffusion seed. The annealing, however, is performed at lower temperatures, so that the "bite of silicide" will not occur even at the element isolation edges and the sidewall edges. Moreover; in the second process of silicidation in the step of FIG. 3C, namely, $$Co_2Si + Si \rightarrow 2CoSi \tag{II}$$

Si acting as the diffusion seed precludes the "bite of silicide" at the ends of the element isolation regions and the ends of the sidewalls.

Now, description will be given of a second embodiment of the present invention. in contrast to the selective deposition of the first metal film in the above-described first embodiment, this second embodiment is a method for depositing the first metal film non-selectively.

Figure 5A:
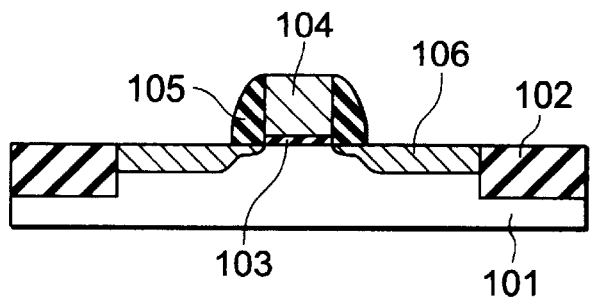
FIGS. 5A through 5E are longitudinal sectional views showing the method for manufacturing a semiconductor device in the order of its steps according to a second embodiment of the present invention.

FIGS. 5A through 5E are longitudinal sectional views showing the present embodiment in the order of its steps. Initially, as shown in FIG. 5A, the same materials and techniques as those in the first embodiment are used to form a MOS transistor which comprises; element isolation regions 102 constituted by silicon oxide films on prescribed areas of a single-conductive type silicon substrate 101, the element isolation regions 102 each having a groove-embedded structure of 300–400 nm in depth and 200–500 nm in width; a gate oxide film 103 having a thickness of 5 nm; a gate silicon film 104 having a width of 100–250 nm and a thickness of 100–150 nm, formed of poly-crystalline silicon; sidewalls 105 formed of silicon oxide films of 80–100 nm in width provided on the sidewall portions of said gate silicon film 104; and reverse-conductive type diffusion layers 106 provided in said silicon substrate 101 at both sides of the sidewalls 105. Here, the sidewalls 105 may be formed somewhat greater in width previously since the sidewalls are subjected to etchback in a following step.

Figure 5B:
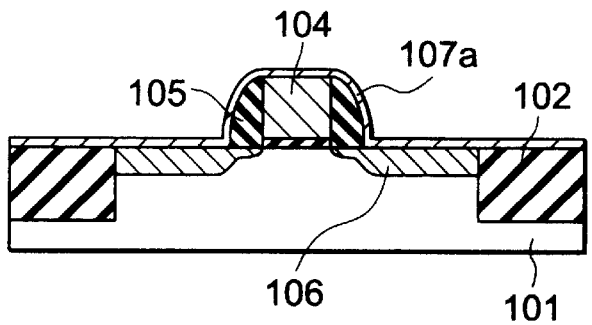

Then, as shown in FIG. 5B, a cobalt film 107a of 10–20 nm in thickness is deposited over the entire surface of the silicon substrate 101 by sputtering or CVD. In depositing the cobalt film over the entire surface of the silicon substrate by CVD, non-selective CVD can be accomplished by using the same gases for selective CVD in the flow-rate ratio stated in the first embodiment, with a film-forming pressure increased up to about 500 Pa.

Figure 5C:
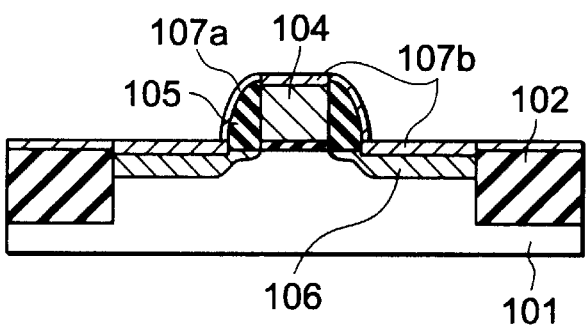

Subsequently, as in FIG. 5C, first annealing is applied to the silicon substrate 101 in vacuum at 450–550° C. for 10–30 seconds to allow the surface portions of the gate silicon film 104 and diffusion layers 106 to react with the cobalt film 107a, forming cobalt silicide films 107b having a composition of $Co_xSi_y$ ($x \geq y$) in a self-aligning fashion. This first annealing preferably follows after the deposition of the cobalt films without breaking the vacuum. If impossible, however, the annealing may be performed in a non-oxidizing atmosphere by ramp rapid thermal annealing. In the reaction of the formula (I) identical to that of the above-described first embodiment at the initial process of the silicidation by this first annealing, Co acts as the diffusion seed to form the cobalt silicide films so as to grow downward. However, this low-temperature annealing precludes "bite of silicide" at the element isolation edges and the sidewall edges. During the following reaction of the formula (II) identical to that of the first embodiment, Si acting as the diffusion seed precludes "bite of silicide" at the element isolation edges and the sidewall edges just all the same.

Figure 5D:
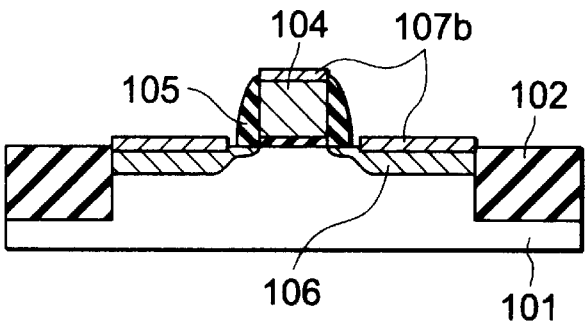

Thereafter, as shown in FIG. 5D, unreacted cobalt films 107a left on the element isolation regions 102 and sidewalls 105 are selectively removed by wet etching with a mixed aqueous solution of ammonia and oxygenated water or a mixed aqueous solution of hydrochloric acid and oxygenated water. Then, the sidewalls 105 are etched back by anisotropic, reactive ion etching which uses a fluorocarbon type gas such as $CF_4$, $C_2F_6$, or $C_4F_8$. Thereby, gaps of 10–20 nm in width are formed between the cobalt silicide films 107b and the edge portions of the sidewalls 105. As in the first embodiment, care must be taken here because excessive etchback would increase the receding amounts of the sidewalls 105 and the silicon oxide films of the element isolation regions 102, possibly eliminating the sidewalls 105 or forming a recess in the element isolation regions. Also as in the first embodiment, attention should be paid to the etch selectivities between the silicon and silicide films and the oxide films in order to prevent the gate silicon film 104 and diffusion layers 106 from receding.

Figure 5E:
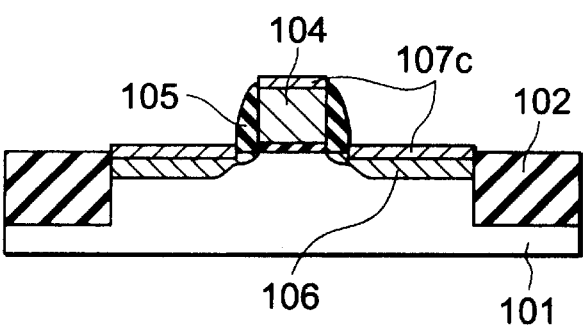

Then, as in FIG. 5E, second annealing is applied thereto by ramp rapid thermal annealing in a nitrogen atmosphere at 700–800° C. for 10–30 seconds. This transforms the above-described cobalt silicide films 107b formed on the surfaces of the gate silicon film 104 and diffusion layers 106 into cobalt disilicide ($CoSi_2$) films 107c which are low in electric resistance and stable thermally. This silicidation process is identical to that of the formula (III) in the first embodiment, so that Co returns to the diffusion seed to facilitate production of "bite." However, due to the fact that the gaps of 10–20 nm in width are previously formed between the cobalt silicide films 107b and the sidewalls 105 by anisotropic etchback, the "bite of silicide" at the ends of the element isolation regions 102 and the ends of the sidewalls 105 can be suppressed. Thus, according to the technique of this second embodiment, the "bite" of silicide films at pattern edges can be suppressed even in finer patterns, making it possible to selectively form on the gate and diffusion layers the cobalt disilicide films 107c which are excellent in inter-element withstand voltage characteristics, p-n junction leakage characteristics, and gate withstand voltage characteristics, and have stable electric characteristics.

Next, a third embodiment of the present invention will be described. The present invention may comprise a technique for non-selectively depositing a first metal film for silicidation before covering and protecting the first metal film with an antioxidant film. The third embodiment relates to this technique.

Figure 6A:
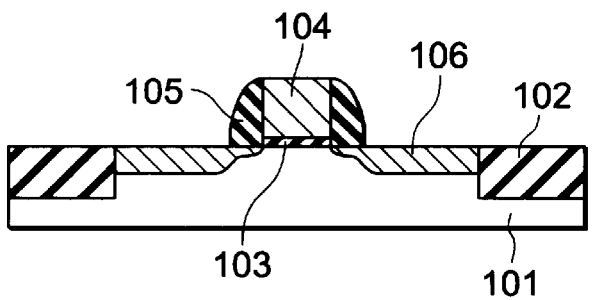
FIGS. 6A through 6E are longitudinal sectional views showing the method for manufacturing a semiconductor device in the order of its steps according to a third embodiment of the present invention.

FIGS. 6A through 6E are longitudinal sectional views showing in the order of its steps the manufacturing method according to the present embodiment. Initially, as shown in FIG. 6A, the same materials and techniques as those in the first and second embodiments are used to form a MOS transistor which comprises: element isolation regions 102 constituted by silicon oxide films provided on prescribed areas of a single-conductive type silicon substrate 101, the element isolation regions 102 having a groove-embedded structure of 300–400 nm in depth and 200–500 nm in width; a gate oxide film 103 having a thickness of 5 nm; a gate silicon film 104 formed of poly-crystalline silicon having a width of 100–250 nm and a thickness of 100–150 nm; sidewalls 105 formed of silicon films of 80–100 nm in width provided on the sidewall portions of said gate silicon film 104; and diffusion layers 106 as source and drain regions of reverse conductive type, formed in said silicon substrate 101 at both sides of the sidewalls 105. Here, the sidewalls may be formed somewhat greater in width previously since the sidewalls are subjected to etchback in a following step.

Figure 6B:
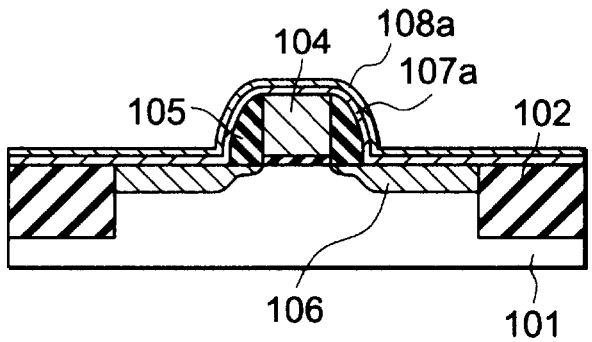

Then, as in FIG. 6B, a cobalt film 107a of 10–20 nm in thickness is deposited over the entire surface of the silicon substrate 101 by sputtering. Subsequently, a tungsten (W) film 108a of 20–30 nm in thickness is deposited on the cobalt film 107a by sputtering. The purpose of this tungsten film 108a is to prevent cobalt from being oxidized during the silicidation annealing. The cobalt film 107a and the tungsten film 108a are desirably deposited in continuous steps without breaking the vacuum. Apart from the tungsten film, the antioxidant film may use a titanium nitride (TiN) film and the like.

Figure 6C:
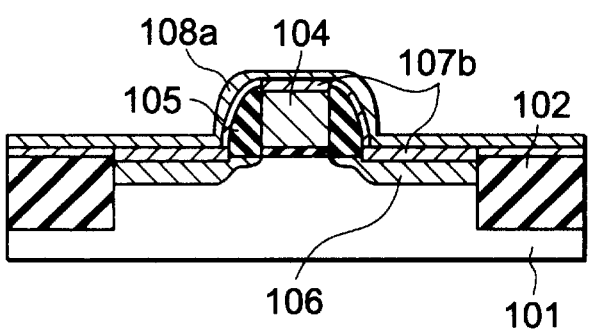

Subsequently, as in FIG. 6C, first annealing is applied to the silicon substrate 101 by ramp rapid thermal annealing method in a nitrogen or non-oxidizing atmosphere at 450–550° C. for 10–30 seconds. This allows the surface portions of the gate silicon film 104 and diffusion layers 106 to react with the cobalt film 107a, forming cobalt silicide films 107b having a composition of $Co_xSi_y$ ($x \geq y$) in a self-aligning fashion. In this annealing step, the tungsten film 108a is excluded from reacting with silicon, being nitrogenized, and letting oxygen pass therethrough; this avoids oxidization of the cobalt film 107a. The initial process of the silicidation in this first annealing is identical to that of the formula (I) in the first embodiment. It follows that while Co acts as the diffusion seed in this reaction to form the cobalt silicide films growing downward, the low-temperature annealing precludes occurrence of the "bite of silicide" at the element isolation edges and the sidewall edges. In the following process of the silicidation, which is the same reaction as that of the formula (II) in the first embodiment, Si acting as the diffusion seed precludes the "bite of silicide" at the element isolation edges and the sidewall edges just all the same.

Figure 6D:
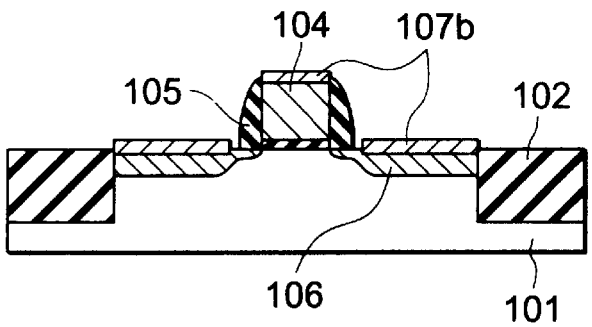

Thereafter, as in FIG. 6D, unreacted cobalt films 107a left to the tungsten film 108a are selectively removed by wet etching with a mixed aqueous solution of ammonia and oxygenated water and a mixed aqueous solution of hydrochloric acid and oxygenated water. Then, the sidewalls 105 are etched back by anisotropic, reactive ion etching which uses a fluorocarbon type gas such as $CF_4$, $C_2F_6$, or $C_4F_0$. This forms gaps of 10–20 nm between the cobalt silicide films 107b and the edge portions of the sidewalls 105. As in either embodiment described above, care must be taken because excessive etchback to the sidewalls would increase the receding amount of the sidewalls 105 to eliminate the sidewalls, and attention also needs to be paid to the etch selectivities so as not to etch the silicon and silicide on the gate and diffusion layers.

Figure 6E:
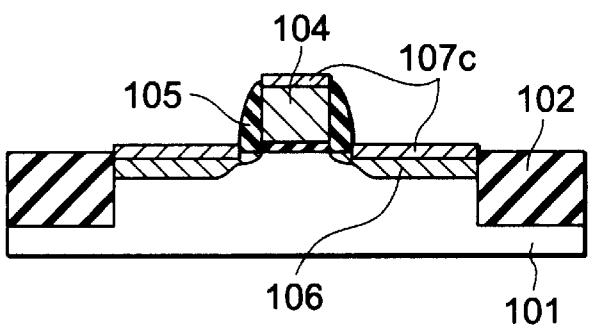

Then, as in FIG. 6E, second annealing is applied thereto by ramp rapid thermal annealing in a nitrogen atmosphere at 700–800° C. for 10–30 seconds to transform the above-described cobalt silicide films 107b formed on the surfaces of the gate silicon film 104 and diffusion layers 106 into cobalt disilicide ($CoSi_2$) films 107c which are low in electric resistance and thermally stable. This silicidation process is identical to that of the formula (III) in the first embodiment; in other words, Co returns to the diffusion seed to facilitate production of the bite. However, the gaps of 10–20 nm in width previously formed between the cobalt silicide films 107b and the sidewalls 105 by the anisotropic etchback allows suppression of the "bite of silicide" at the element isolation edges and the sidewall edges. According to this technique, the "bite" of silicide films at pattern edges can be suppressed even in finer patterns to selectively form on the gate and diffusion layers cobalt disilicide films which are excellent in inter-element withstand voltage characteristics, p-n junction leakage characteristics, and gate withstand voltage characteristics, and have stable electric characteristics The foregoing embodiments are described merely by way of example of the present invention. It will be appreciated that various modifications may be made within the scope of the present invention as defined by the appended claims.

What is claimed is:

1. A method for manufacturing a semiconductor device, comprising the steps of:

forming a gate electrode, sidewalls provided on both side surfaces of said gate electrode, and diffusion layers formed at a surface of a silicon substrate by a self-aligning technique within an element forming region defined by element isolation regions provided on said silicon substrate; and forming a silicide film at least on the surfaces of said diffusion layers, the step of forming a silicide film including the steps of:
  selectively forming a first metal film on substantially all of an exposed surface portion of said silicon substrate forming said diffusion layers,
  applying first annealing thereto to allow at least said diffusion layers to react with said first metal film,
  removing part of said sidewalls to form a gap with said first metal film, and
  performing second annealing at a temperature higher than that of said first annealing to complete formation of said silicide film.

2. The method for manufacturing a semiconductor device according to claim 1, wherein said gate electrode is formed of poly-crystalline silicon, and said first metal film is also formed on said gate electrode.

3. The method for manufacturing a semiconductor device according to claim 2, wherein said first metal film is formed by either sputtering or chemical vapor deposition.

4. The method for manufacturing a semiconductor device according to claim 2, wherein said first metal film is formed of either cobalt or nickel.

5. The method for manufacturing a semiconductor device according to claim 1, wherein said first metal film is formed by either chemical vapor deposition or electroless plating.

6. The method for manufacturing a semiconductor device according to claim 1, wherein said first metal film is formed of either cobalt or nickel.

7. A method for manufacturing a semiconductor device, comprising the steps of:

forming a gate electrode, sidewalls provided on both side surfaces of said gate electrode, and diffusion layers formed at a surface of a silicon substrate by a self-aligning technique within an element forming region defined by element isolation regions provided on said silicon substrate; and forming a silicide film at least on the surfaces of said diffusion layers, the step of forming a silicide film including the steps of:
  forming a first metal film on said silicon substrate including an exposed silicon surface within a boundary of said diffusion layers,
  applying first annealing thereto to allow at least said exposed silicon surface of said diffusion layers to partially react with said first metal film,
  selectively removing an unreacted portion of said first metal film,
  removing part of said sidewalls to form a gap with said first metal film, and
  performing second annealing at a temperature higher than that of said first annealing to complete formation of said silicide film.

8. The method for manufacturing a semiconductor device according to claim 7, wherein said gate electrode is formed of poly-crystalline silicon, and said first metal film is also allowed to react with the upper surface of said gate electrode.

9. The method for manufacturing a semiconductor device according to claim 7, wherein said first metal film is formed by either sputtering or chemical vapor deposition.

10. The method for manufacturing a semiconductor device according to claim 7, wherein said first metal film is formed of either colbalt or nickel.

11. A method for manufacturing a semiconductor device, comprising the steps of:

forming a gate electrode, sidewalls provided on both side surfaces of said gate electrode, and diffusion layers formed at a surface of a silicon substrate by a self-aligning technique within an element forming region defined by element isolation regions provided on said silicon substrate; and forming a silicide film at least on the surfaces of said diffusion layers, the step of forming a silicide film including the steps of:
  forming a first metal film on said silicon substrate including an exposed silicon surface within a boundary of said diffusion layers,
  forming a second metal film on said first metal film,
  applying first annealing thereto to allow at least said exposed silicon surface of said diffusion layers to partially react with said first metal film,
  selectively removing said second metal film and an unreacted portion of said first metal film,
  removing part of said sidewalls to form a gap with said first metal film, and
  performing second annealing at a temperature higher than that of said first annealing to complete formation of said silicide film.

12. The method for manufacturing a semiconductor device according to claim 11, wherein said gate electrode is formed of poly-crystalline silicon, and said first metal film is also allowed to react with the upper surface of said gate electrode.

13. The method for manufacturing a semiconductor device according to claim 11, wherein said second metal film is formed of either titanium nitride or tungsten (W).

* * * * *